(12) United States Patent
Komoriyama et al.

(10) Patent No.: US 12,191,845 B2
(45) Date of Patent: Jan. 7, 2025

(54) LOAD DRIVE DEVICE

(71) Applicant: Hitachi Astemo, Ltd., Hitachinaka (JP)

(72) Inventors: Keishi Komoriyama, Hitachinaka (JP); Yoichiro Kobayashi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 233 days.

(21) Appl. No.: 17/786,009

(22) PCT Filed: Dec. 11, 2020

(86) PCT No.: PCT/JP2020/046238
§ 371 (c)(1),
(2) Date: Jun. 16, 2022

(87) PCT Pub. No.: WO2021/131778
PCT Pub. Date: Jul. 1, 2021

(65) Prior Publication Data
US 2023/0016629 A1    Jan. 19, 2023

(30) Foreign Application Priority Data
Dec. 26, 2019 (JP) .................................. 2019-237205

(51) Int. Cl.
*H03K 17/082* (2006.01)
*H02H 1/00* (2006.01)
*H03F 3/45* (2006.01)

(52) U.S. Cl.
CPC ..... *H03K 17/0822* (2013.01); *H03F 3/45475* (2013.01); *H02H 1/0007* (2013.01)

(58) Field of Classification Search
CPC ....... H03K 17/0822; H03K 2017/0806; H03K 2217/0072; H03F 3/45475; H03F 3/211;
(Continued)

(56) References Cited

U.S. PATENT DOCUMENTS 5,731,946 A    3/1998 Kahr
8,116,052 B2 *  2/2012 Nakahara ........... H03K 17/0822
                                            361/91.7
(Continued)

FOREIGN PATENT DOCUMENTS

JP    2002-502546 A    1/2002
JP    2008-539625 A    11/2008
(Continued)

OTHER PUBLICATIONS

Wada Shinichirou; WO-2018042881; Title: Semiconductor device; Publication date: Mar. 8, 2018; Entire specification and abstract, and drawings (Year: 2018).*

(Continued)

*Primary Examiner* — Dharti H Patel
(74) *Attorney, Agent, or Firm* — Volpe Koenig

(57) ABSTRACT

Achieved is a load drive device capable of suppressing local concentration of temperature at the time of absorbing a counter electromotive force of an inductive load while suppressing a size of a power transistor. The load drive device includes a first transistor connected between a first control electrode and an inductive load. Further, the load drive device includes an active clamp circuit that becomes conductive when a terminal voltage of a second control electrode between the first transistor and the inductive load exceeds a threshold. Furthermore, the load drive device includes a second transistor connected to the second control electrode and connected in parallel to the first transistor.

9 Claims, 9 Drawing Sheets

(58) Field of Classification Search
CPC ....... H03F 1/301; H03F 3/345; H02H 1/0007; H01F 7/18
USPC ........................................................ 361/91.1
See application file for complete search history.

(56) References Cited

U.S. PATENT DOCUMENTS

| | | | |
|---|---|---|---|
| 11,676,752 B2* | 6/2023 | Buzzetti | H01F 7/064 361/149 |
| 2006/0103428 A1* | 5/2006 | Shimada | H03K 17/063 326/83 |
| 2010/0033230 A1 | 2/2010 | Lueders et al. | |
| 2010/0134941 A1* | 6/2010 | Nakahara | H03K 17/0822 361/91.1 |
| 2014/0022001 A1* | 1/2014 | Nakahara | H01L 27/088 327/380 |
| 2016/0218611 A1* | 7/2016 | Lollio | H03K 17/0822 |
| 2017/0288662 A1* | 10/2017 | Djelassi | H03K 17/162 |
| 2017/0302260 A1* | 10/2017 | Iwamizu | H03K 17/081 |
| 2019/0260371 A1 | 8/2019 | Wada et al. | |
| 2019/0288677 A1* | 9/2019 | Yoshida | H01L 23/62 |
| 2023/0043943 A1* | 2/2023 | Errico | H03K 17/162 |
| 2024/0072785 A1* | 2/2024 | Finney | H03K 17/08104 |

FOREIGN PATENT DOCUMENTS

| | | | | |
|---|---|---|---|---|
| JP | 2008-295277 A | 12/2008 | | |
| JP | 2014-127953 A | 7/2014 | | |
| JP | 2014-138303 A | 7/2014 | | |
| JP | 2018-037932 A | 3/2018 | | |
| JP | 2019-216519 A | 12/2019 | | |
| WO | WO-2018042881 A1 * | 3/2018 | ......... | H01L 21/822 |
| WO | WO-2021024813 A1 * | 2/2021 | ......... | H01L 27/0255 |

OTHER PUBLICATIONS

International Search Report, PCT/JP2020/046238, Mar. 9, 2021, 2 pgs.

* cited by examiner

LOAD DRIVE DEVICE

TECHNICAL FIELD

The present invention relates to a load drive device.

BACKGROUND ART

As a background art in this technical field, there is a technique described in PTL 1. PTL 1 describes a technique for reducing power consumption of a power transistor in a control device that controls the operation of an inductive load.

That is, a configuration in which a resistor and a switch means connected in series with each other are connected in parallel to the power transistor connected to the inductive load is described. Then, the power transistor and the switch means are simultaneously turned on and off. A current flowing through the inductive load is caused to flow through the power transistor and the resistor and the switch means connected in parallel therewith, and the current flowing through the power transistor is reduced to reduce the power consumption.

CITATION LIST

Patent Literature

PTL 1: JP 2002-502546 A

SUMMARY OF INVENTION

Technical Problem

In a semiconductor device in which an inductive load such as a relay coil is driven by a power transistor, a high counter electromotive voltage is generated due to inductivity of a load when the power transistor is interrupted. It is required to suppress the counter electromotive voltage to a maximum rated voltage or less in order to prevent the counter electromotive voltage from breaking the semiconductor device down.

As a method for suppressing the counter electromotive voltage to a breakdown voltage or less, for example, a method of providing an active clamp circuit at a drain and a gate of the power transistor can be considered.

Here, when the active clamp circuit operates, for example, the counter electromotive voltage can be limited by a relatively high voltage such as about 30 to 50 V in a system using a battery of 12 V as a power supply.

However, it takes time to make a current amount zero, and thus, the instantaneous power becomes the largest in this period.

Due to this high power consumption, the power transistor rapidly generates heat.

In a case where it is desired to suppress heat generation so as not to reach a temperature at which the power transistor breaks down, in general, it is possible to achieve the goal by increasing a size of the transistor.

However, there is a problem that an increase in transistor size causes an increase in chip cost.

In particular, in a relatively large power transistor, heat dissipation performance in a central region is worse than that in a peripheral region, and the temperature is the highest at the center. As a result, there are a problem that it is difficult to obtain a temperature reduction effect of the power transistor by the amount corresponding to the size increase, and a problem that it is difficult to increase a use environment temperature of the power transistor.

Further, the heat dissipation performance can be enhanced by dividing the power transistor into a plurality of sections and arranging the sections at intervals.

However, it is not allowed to increase a wiring resistance connecting the sections in order to achieve a low on-resistance, which is an important characteristic as the switch. Therefore, there is a problem that the restriction in the arrangement of the power transistor increases in this case.

In PTL 1, the resistor is used as a main current path in a period in which the inductive load is driven in order to suppress the power consumption of the power transistor, and the amount of the current is finely adjusted by power transistors connected in parallel.

In the control device of the load of PTL 1, however, the power transistor and the switch means are simultaneously turned off, and thus, it is difficult to disperse a counter electromotive force, generated when a drive circuit is interrupted, to the switch means and the resistor.

In such a load control device, heat dissipation of self-heating in the power transistor itself is not performed in time at the time of load interruption when instantaneous power consumption is maximized, and there is a possibility that the load control device is destroyed due to local concentration of heat.

Therefore, an object of the present invention is to achieve a load drive device capable of suppressing local concentration of temperature at the time of absorbing a counter electromotive force of an inductive load while suppressing a size of a power transistor.

Solution to Problem

In order to solve the above problems, the present invention is configured as follows.

A load drive device of the present invention includes: a first transistor connected between a first control electrode and an inductive load; an active clamp circuit that causes a current to flow when a terminal voltage of a second control electrode between the first transistor and the inductive load exceeds a threshold; and a second transistor connected to the second control electrode and connected in parallel to the first transistor.

Further, a load drive device of the present invention includes: a first transistor connected between a first control electrode and an inductive load; a second transistor connected to the second control electrode and connected in parallel to the first transistor; and a second transistor control signal output unit that turns on the second transistor at a timing when the first transistor is turned off.

Advantageous Effects of Invention

According to the present invention, it is possible to achieve the load drive device capable of suppressing the local concentration of temperature at the time of absorbing the counter electromotive force of the inductive load while suppressing the size of the power transistor.

Other objects, configurations, and effects which have not been described above become apparent from embodiments to be described hereinafter.

DESCRIPTION OF EMBODIMENTS

Hereinafter, embodiments of the present invention will be described with reference to accompanying drawings.

EMBODIMENTS

First Embodiment

Figure 1:
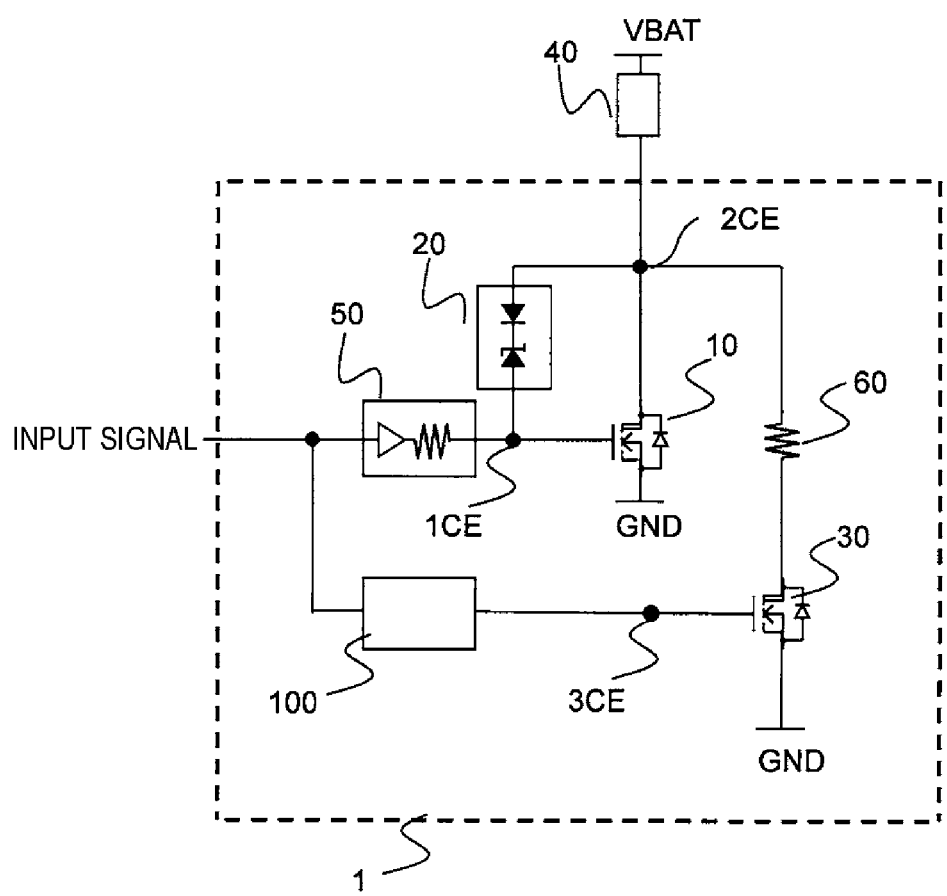
FIG. 1 is a diagram illustrating a load drive device according to a first embodiment of the present invention.

FIG. 1 is a diagram illustrating a load drive device 1 according to a first embodiment of the present invention.

In FIG. 1, the load drive device 1 includes a first transistor 10, an active clamp circuit 20, a second transistor 30, a buffer circuit 50, a resistor 60, and a trigger circuit 100.

The first transistor 10 is connected between a first control electrode 10E and an inductive load 40. Then, the first transistor 10 has a gate connected to the first control electrode 10E, a source connected to GND, and a drain connected to a second control electrode 2CE.

The active clamp circuit 20 has one end connected to the first control electrode 10E and the other end connected to the second control electrode 2CE. Then, when a differential voltage between the second control electrode 2CE and the first control electrode 10E exceeds a certain threshold larger than a battery voltage VBAT, the active clamp circuit 20 causes a current corresponding to the differential voltage to flow through an output resistance of the buffer circuit 50. This means that the active clamp circuit 20 causes 10E current to flow from the second control electrode 2CE to the first control electrode when a terminal voltage of the second control electrode 2CE between the first transistor 10 and the inductive load 40 exceeds a threshold.

The second transistor 30 is connected to the second control electrode 2CE and connected in parallel to the first transistor 10. Then, the second transistor 30 has a gate connected to a third control electrode 3CE, a source connected to GND, and a drain connected to one end of the resistor 60. Further, the second transistor 30 is arranged to have an interval for securing heat dissipation performance from the first transistor 10.

The buffer circuit 50 is connected to the first transistor 10 via the first control electrode 10E in order to drive the first transistor 10, and receives an input of an input signal for driving the inductive load 40. Further, an output terminal of the buffa circuit 50 is connected to the first control electrode 10E. Further, the buffer circuit 50 has a finite output resistance component, and a release voltage thereof is set to a value (hereinafter, a value sufficient for turning on the transistor is referred to as a gate Hi-level) that is sufficient to turn on the first transistor 10 when the input signal is equal to or more than a predetermined threshold (hereinafter, referred to as an input Hi-level).

Further, the release voltage of the buffer circuit 50 is set to a value (hereinafter, a value sufficient to turn off the transistor is referred to as a gate Lo-level) that is sufficient to turn off the first transistor 10 when the input signal is equal to or less than a predetermined threshold (hereinafter, referred to as an input Lo-level).

The resistor 60 is connected in series to the second transistor 30, and has the one end connected to the drain of the second transistor 30 and the other end connected to the second control electrode 2CE. Further, the resistor 60 is arranged to have an interval from the first transistor 10 to secure the heat dissipation performance.

The trigger circuit 100 (a first trigger output circuit) outputs a trigger signal from a time point at which the input signal with respect to the buffer circuit 50 is switched from ON to OFF. Then, the conduction of the second transistor 30 is controlled by the trigger signal output from the trigger circuit 100. The trigger circuit 100 receives an input of the same input signal as the input signal with respect to the buffer circuit 50, and has an output terminal connected to the gate of the second transistor 30 via the third control electrode 3CE. The trigger circuit 100 outputs a signal of the gate Hi-level for turning on the second transistor 30 only for a predetermined time from a time point at which the input signal with respect to the trigger circuit 100 transitions from the input Hi-level to the input Lo-level. At the other time points, the trigger circuit 100 outputs a signal of the gate Lo-level for turning off the second transistor 30. That is, the trigger circuit 100, which is a second transistor control signal output unit, turns on the second transistor at a timing when the first transistor 10 is turned off.

Further, the inductive load 40 has one end connected to the battery voltage VBAT and the other end connected to the second control electrode 2CE.

Next, the operation of the device illustrated in FIG. 1 will be described with reference to FIG. 2.

Figure 2:
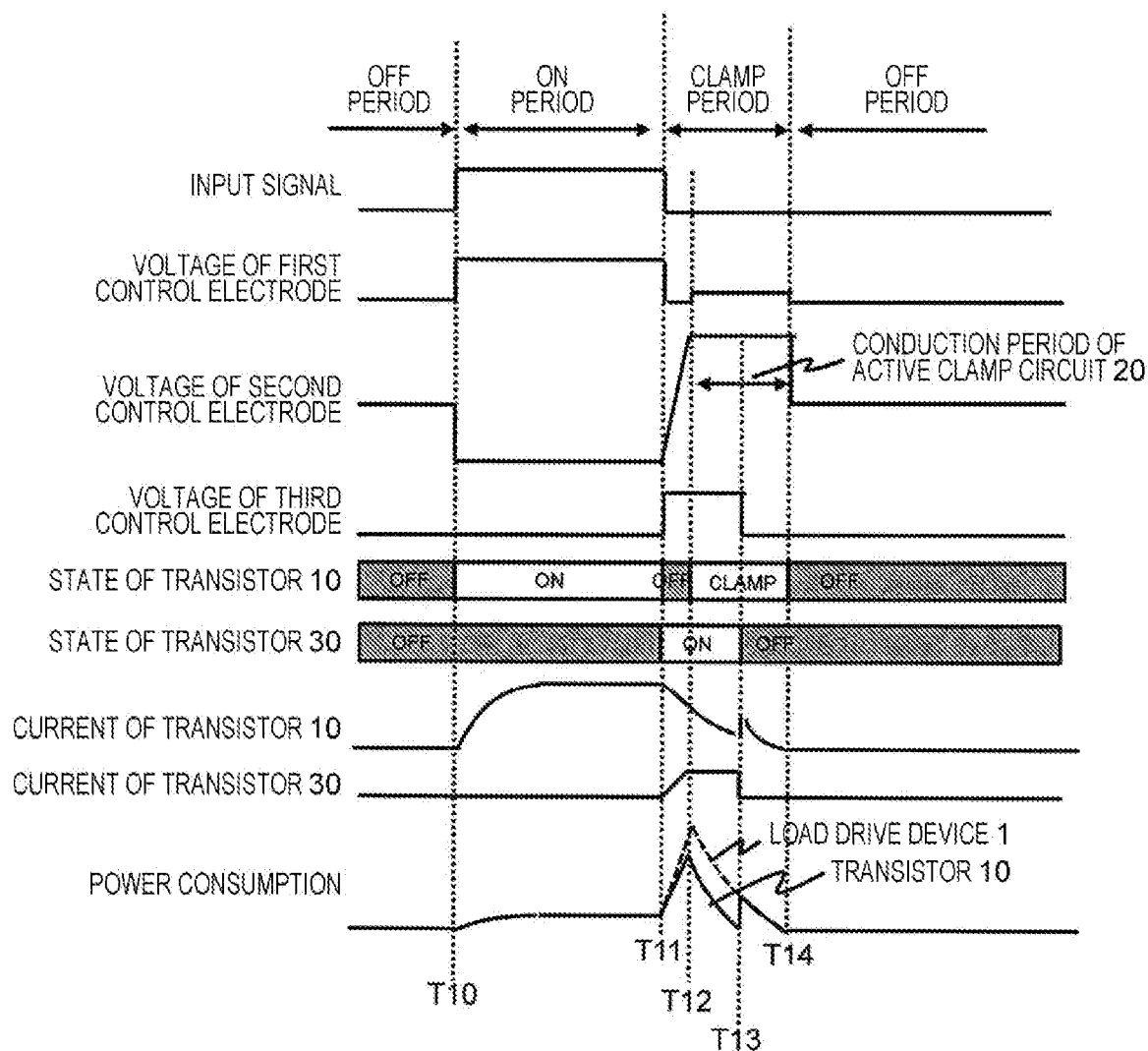
FIG. 2 is a timing chart for describing the operation of the device illustrated in FIG. 1.

FIG. 2 is an example of a timing chart for describing the operation of the device illustrated in FIG. 1, and illustrates a temporal change of the load drive device 1 that starts from an OFF state, transitions to an ON state, and then, returns to the OFF-state again through a clamp period in which an active clamp operation is performed.

Here, the OFF state of the load drive device 1 is a state in which no current flows through the induced load 40 in the following description, and refers to a state in which voltages of the first control electrode 10E and the third control electrode 3CE are sufficiently low. That is, the OFF state of the load drive device is a state in which the first transistor 10 and the second transistor 30 are turned off, and the active clamp circuit 20 is not conductive. Therefore, the voltage of the second control electrode 2CE is in a state of being raised to the battery voltage VBAT connected to the induced load 40 in the OFF state of the load drive device 1.

Further, the ON state of the load drive device 1 is a state of being conductive to cause a current to flow through the induced load 40, and refers to a state in which the voltage of the first control electrode 10E is at the gate Hi-level. That is, the ON state of the load drive device 1 is a state in which the first transistor 10 is turned on and the second transistor 30 is turned off. Therefore, the voltage of the second control electrode 2CE is in the state of being lower than the battery voltage VBAT in the ON state of the load drive device 1.

Further, the clamp period is a transient period generated when the load drive device 1 transitions from the ON state to the OFF state. That is, the clamp period refers to a state in which the second control electrode 2CE rises from a state of being lower than the battery voltage VBAT to a voltage higher than the battery voltage VBAT due to the release of energy, stored in the inductive load 40, through an internal circuit of the load drive device 1 in the ON state of the load drive device 1, and thereafter, settles at a voltage level in the OFF state.

The maximum voltage value of the second control electrode 2CE at this time is clamped to be equal to or lower than a certain value by conduction of the active clamp circuit 20, and is thus referred to as the clamp period. During this period, the amount of current flowing through the induced load 40 changes to the OFF state.

In FIG. 2, T10 is a time when the input signal is turned on, and T11 is a time when the input signal is turned off. Further, T12 is an operation start time of the active clamp circuit 20, and T13 is an interruption time of the second transistor 30. Further, T14 is an operation end time of the active clamp circuit 20, and CLAMP is a clamp operation period caused by conduction of the active clamp circuit 20.

First, it is considered that the input signal input to the load drive device 1 is switched from the input Lo-level to the input Hi-level at time T10 illustrated in FIG. 2.

At this time, the active clamp circuit 20 is not conductive, the voltage of the first control electrode 10E becomes the gate Hi-level of the first transistor 10 by the buffer circuit 50, and the first transistor 10 is turned on. As a result, the voltage of the second control electrode 2CE is dropped with respect to the GND level, and a drain current starts to flow through the first transistor 10.

At this time point, an output of the trigger circuit 100 is the gate Lo-level of the second transistor 30, and thus, the second transistor 30 is maintained off, and no current flows through the second transistor 30.

Next, it is considered that the input signal is switched from the input Hi-level to the input Lo-level at time T11.

First, from time T11 to time T12 when the clamp period starts, the active clamp circuit 20 is not conductive, the voltage of the first control electrode 10E becomes the gate Lo-level by the buffer circuit 50, and the first transistor 10 is turned off.

On the other hand, the voltage of the third control electrode 3CE becomes the gate Hi-level of the second transistor 30 by the trigger circuit 100 so that the second transistor 30 is turned on. At this time, the drain current flowing through the second transistor 30 is determined from a series resistance value of the resistor 60 and the second transistor 30 and a voltage value of the second control electrode 2CE. If this is set to be smaller than the amount of current flowing through the load drive device 1 at a time point in time T11, the voltage of the second control electrode 2CE continues to rise beyond the battery voltage VBAT.

Then, at time T12, the voltage of the second control electrode 2CE exceeds a certain threshold of the active clamp circuit 20, and the active clamp circuit 20 becomes conductive. When the active clamp circuit 20 becomes conductive, the current flows through the output resistance component of the buffer circuit 50, and the voltage of the first control electrode 10E rises. Eventually, the first transistor 10 becomes conductive such that the voltage of the second control electrode 2CE reaches a peak at a constant value.

At this time point, the first transistor 10 consumes the maximum instantaneous power. At the same time, however, the second transistor 30 is turned on, and thus, part of energy released from the inductive load 40 is distributed to the second transistor 30 and the resistor 60. Therefore, heat generation is not concentrated and is dispersed to the respective parts.

Finally, at time T13, the output of the trigger circuit 100 ends and is lowered to the gate Lo-level of the second transistor 30. Here, a path of the second transistor 30 is interrupted, and thereafter, the entire remaining energy starts to be consumed in the first transistor 10, the current flowing through the load becomes zero at time T14, and the clamp period ends.

Through the above operation, the power consumption is distributed to the first transistor 10, the second transistor 30, and the resistor 60 from time T12 at which the instantaneous power consumption is the highest to time T13 during the clamp period.

Therefore, the heat generation is dispersed without being concentrated, and a local peak temperature can be lowered. Thus, an operation temperature range can be widened as a whole.

In particular, the second transistor 30 and the resistor 60 do not need to be connected with a low resistance as compared with the first transistor 10 that has a low resistance when turned on but has a high resistance when turned off. Therefore, the arrangement away from a heat source is possible, and thus, the heat dissipation efficiency can be improved as compared with the first transistor 10. In this case, the peak temperature can be suppressed with a smaller area as compared with a case of simply widening the area of the first transistor 10.

According to the first embodiment of the present invention, it is possible to achieve the load drive device capable of suppressing local concentration of temperature at the time of absorbing a counter electromotive force of the inductive load while suppressing a size of a power transistor.

Second Embodiment

Next, a second embodiment of the present invention will be described.

Figure 3:
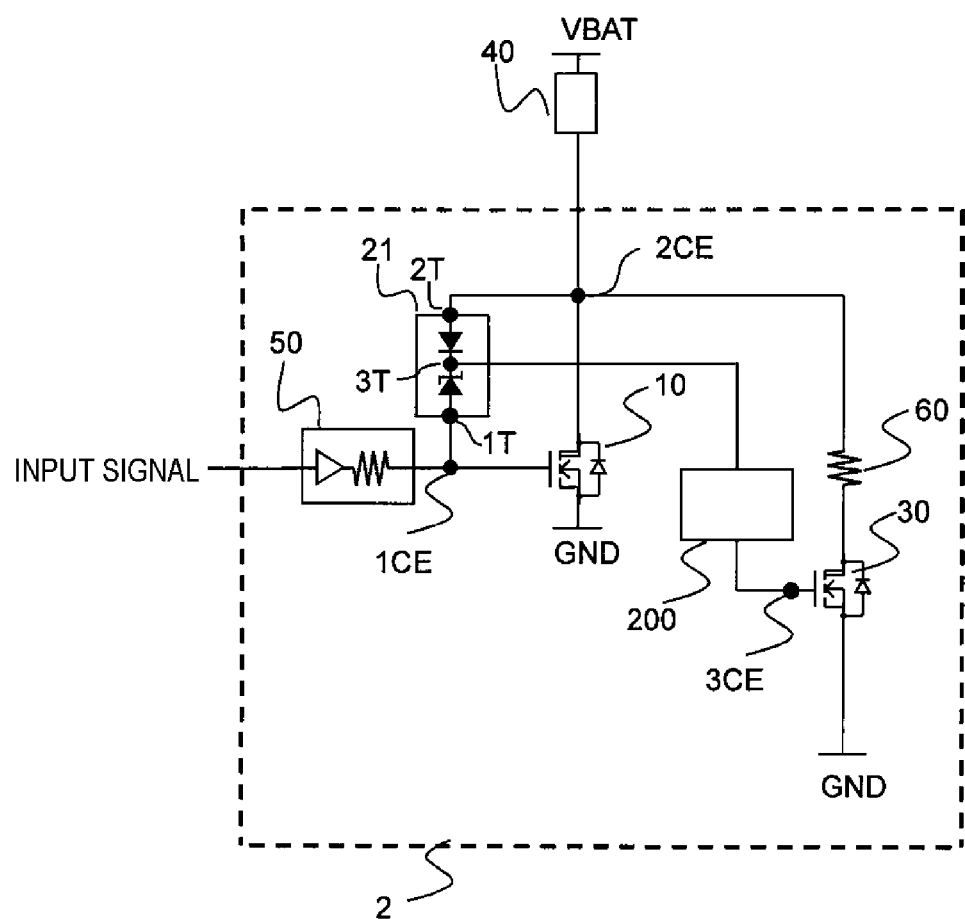
FIG. 3 is a circuit diagram of a load drive device according to a second embodiment of the present invention.

FIG. 3 is a diagram illustrating a load drive device 2 according to the second embodiment.

In FIG. 3, the load drive device 2 includes an active clamp circuit 21 and a trigger circuit 200.

A difference between the first embodiment and the second embodiment is a connection point of the trigger circuit 100 and a connection point of the trigger circuit 200. The other configurations have the same functions as the configurations denoted by the same reference signs illustrated in FIG. 1 described above, and thus, the description thereof will be omitted.

In the active clamp circuit 21, a first terminal 1T (connected to an anode of a Zener diode) is connected to the first control electrode 10E, a second terminal 2T (connected to an anode of a diode) is connected to the second control electrode 2CE, and a third terminal 3T (connected to a connection point between the diode and the Zener diode) is connected to an input terminal of the trigger circuit 200.

Then, when a differential voltage between the second control electrode 2CE and the first control electrode 10E exceeds a certain threshold larger than the battery voltage VBAT, the active clamp circuit 21 causes a current corresponding to the differential voltage to flow to the second terminal 2T. Further, the third terminal 3T is an intermediate node between the first terminal 1T and the second terminal 2T.

The trigger circuit 200 (a second trigger output circuit) outputs a trigger signal from a time point at which the active clamp circuit 21 becomes conductive. The conduction of the second transistor 30 is controlled by the trigger signal output from the trigger circuit 200. The trigger circuit 200 has the input terminal connected to the third terminal 3T of the active clamp circuit 21 and an output terminal connected to the third control electrode 3CE. Then, the trigger circuit 200 outputs the gate Hi-level of the second transistor 30 only for a predetermined time when a voltage of the input terminal exceeds a predetermined threshold voltage, and outputs the gate Lo-level of the second transistor 30 at the other time points.

Here, the predetermined threshold voltage is set to a voltage level of the third terminal 3T only when the active clamp circuit 21 is conductive. Therefore, it is assumed that the output of the trigger circuit 200 is switched simultaneously with the conduction of the active clamp circuit 21.

Hereinafter, the operation of the device illustrated in FIG. 3 will be described with reference to FIG. 4.

Figure 4:
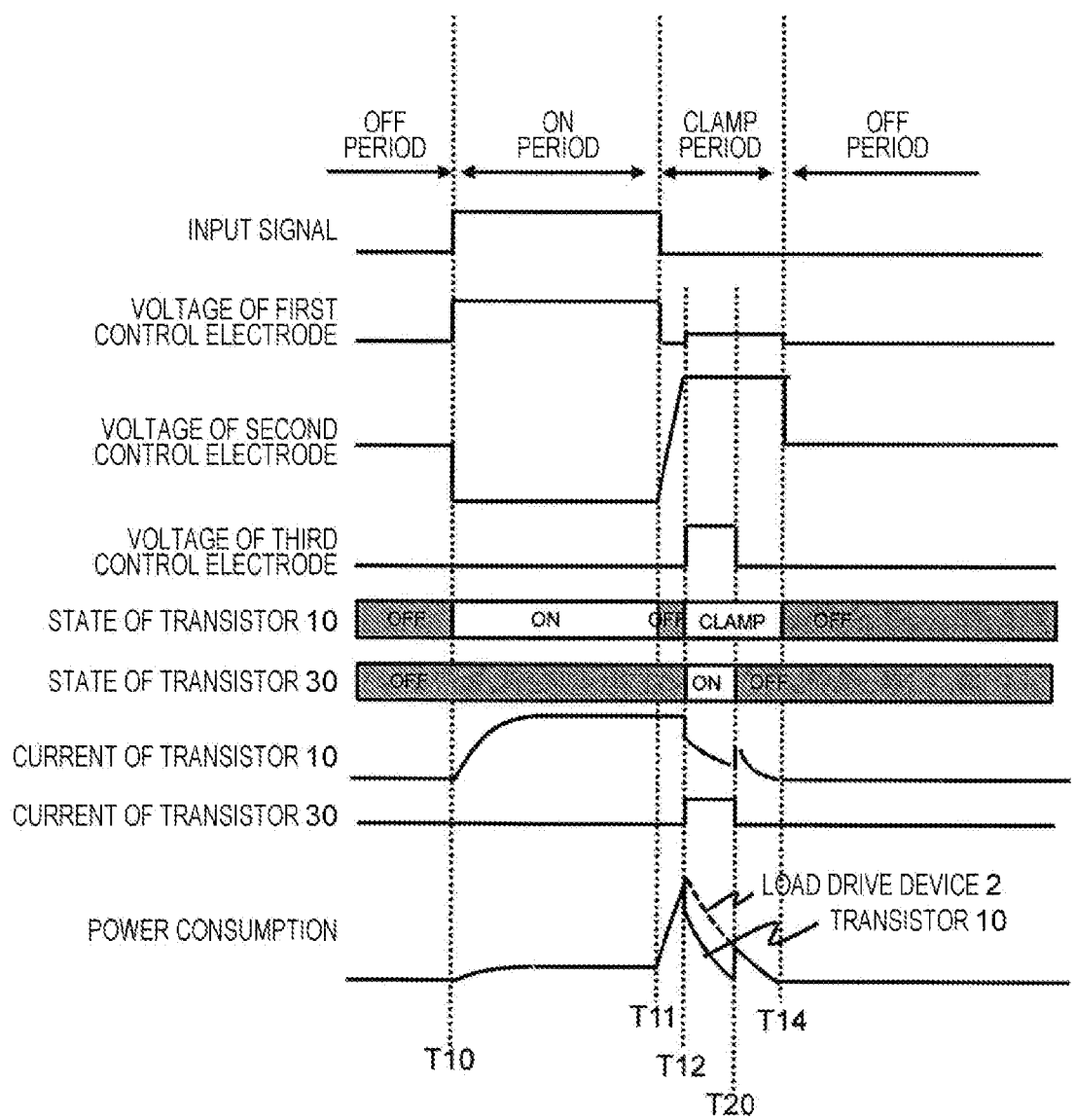
FIG. 4 is a timing chart for describing a control timing of the load drive device illustrated in FIG. 3.

FIG. 4 is an example of a timing chart for describing the operation of the device illustrated in FIG. 3. In FIG. 4, T10 is a time when the input signal is turned on, and T11 is a time when the input signal is turned off. Further, T12 is an operation start time of the active clamp circuit 21, and T20 is an interruption time of the second transistor 30. Further, T14 is an operation end time of the active clamp circuit 20, and CLAMP is a clamp operation period caused by conduction of the active clamp circuit 21.

A difference between the second embodiment and the first embodiment is the operation after time T11.

In FIG. 4, the voltage of the third control electrode 3CE is maintained at the gate Lo-level of the second transistor 30 by the trigger circuit 200 while the active clamp circuit 21 is not conductive from time T11 to time T12. Then, both the first transistor 10 and the second transistor 30 are turned off. During this period, the voltage of the second control electrode 2CE rises. Note that a load current during this period is mainly used for the voltage rise due to charging of a capacitive component of the second control electrode 2CE, and thus, power consumption is small, and heat generation can be ignored.

At time T12, the active clamp circuit 21 becomes conductive, and the voltage of the second control electrode 2CE is clamped to be equal to or lower than a certain value. At this time point, the first transistor 10 consumes the maximum instantaneous power. However, the second transistor 30 is turned on from this time point, and thus, part of energy released from the inductive load 40 is distributed to the second transistor 30 and the resistor 60. Therefore, heat generation is not concentrated and is dispersed to the respective parts.

Finally, at time T20, the output of the trigger circuit 200 ends and is lowered to the gate Lo-level of the second transistor 30. Here, a path of the second transistor 30 is interrupted, and thereafter, the entire remaining energy starts to be consumed in the first transistor 10, the current flowing through the inductive load 40 becomes zero at time T14, and the clamp period ends.

Through the above operation, the second embodiment can obtain the same effects as those of the first embodiment. In addition, it is possible to achieve the load drive device capable of reliably distributing the heat generated by the maximum power during the clamp period regardless of the time until the active clamp circuit 21 operates.

Third Embodiment

Next, a third embodiment of the present invention will be described.

Figure 5:
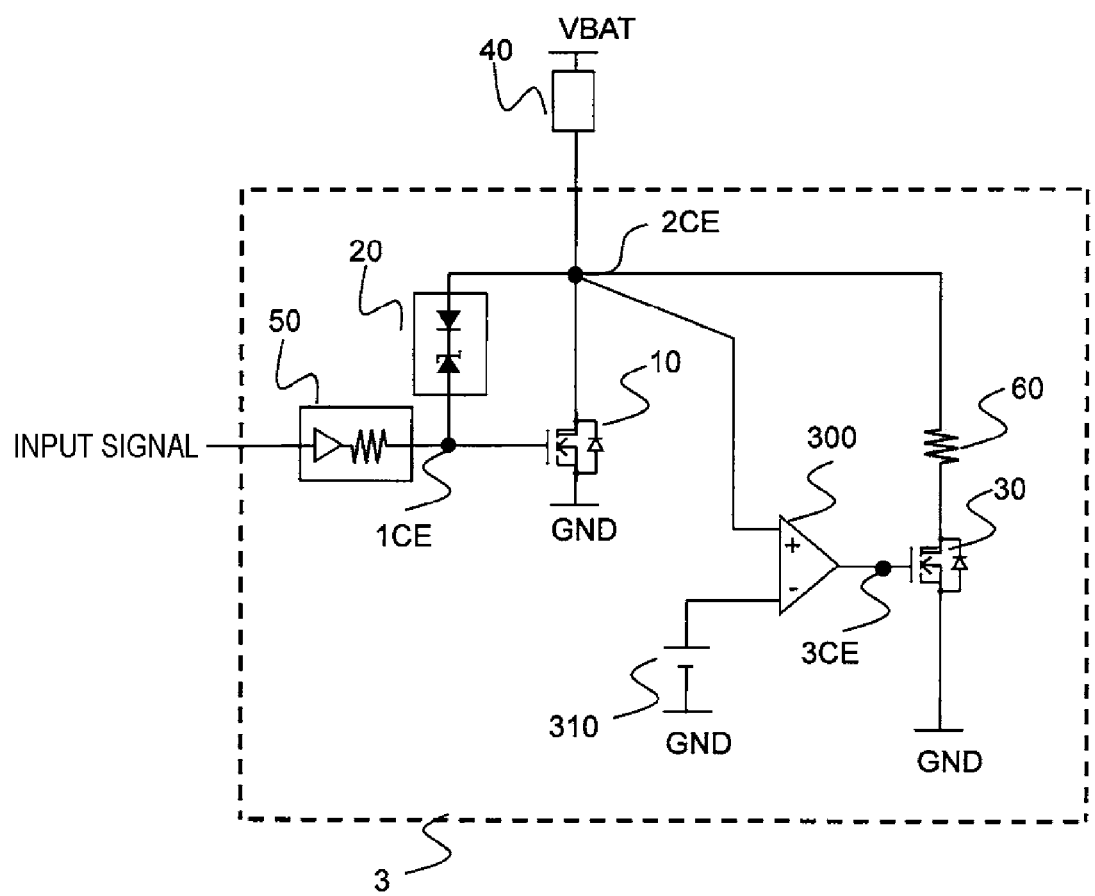
FIG. 5 is a circuit diagram of a load drive device according to a third embodiment of the present invention.

FIG. 5 is a circuit diagram illustrating a load drive device 3 according to the third embodiment.

In FIG. 5, the load drive device 3 includes a voltage amplifier (voltage amplifier circuit) 300 and a reference voltage source 310.

The third embodiment is different from the first embodiment in that the trigger circuit 100 is omitted and the voltage amplifier 300 and the reference voltage source 310 are added. The other configurations have the same functions as the configurations denoted by the same reference signs illustrated in FIG. 1 described above, and thus, the description thereof will be omitted.

The voltage amplifier 300 compares a voltage of the second control electrode 2CE with a predetermined voltage threshold. Then, the voltage amplifier 300 outputs a voltage level obtained by amplifying a differential voltage between the voltage of the second control electrode 2CE and the predetermined voltage threshold. The conduction of the second transistor 30 is controlled by the voltage level amplified by the voltage amplifier 300.

In the voltage amplifier 300, a first input terminal (non-inverting input terminal) is connected to the second control electrode 2CE, a second input terminal (inverting input terminal) is connected to an output terminal of the reference voltage source 310, and an output terminal is connected to the third control electrode 3CE. Then, the voltage amplifier 300 outputs a voltage corresponding to a differential voltage between the first input terminal and the second input terminal from the output terminal.

Further, the maximum voltage that can be output from the voltage amplifier 300 is equal to or higher than the gate Hi-level of the second transistor 30, and the minimum voltage that can be output is equal to or lower than the gate Lo-level of the second transistor 30.

The reference voltage source 310 has an output terminal (positive terminal) connected to the second input terminal (inverting input terminal) of the voltage amplifier 300 and a reference terminal (negative terminal) connected to a reference potential (GND). Then, the reference voltage source 310 applies a predetermined voltage VREF between the output terminal and the reference terminal. Further, the voltage VREF is set to a value lower than a certain threshold at which the active clamp circuit 20 becomes conductive.

Hereinafter, the operation of the device illustrated in FIG. 5 will be described with reference to FIG. 6.

Figure 6:
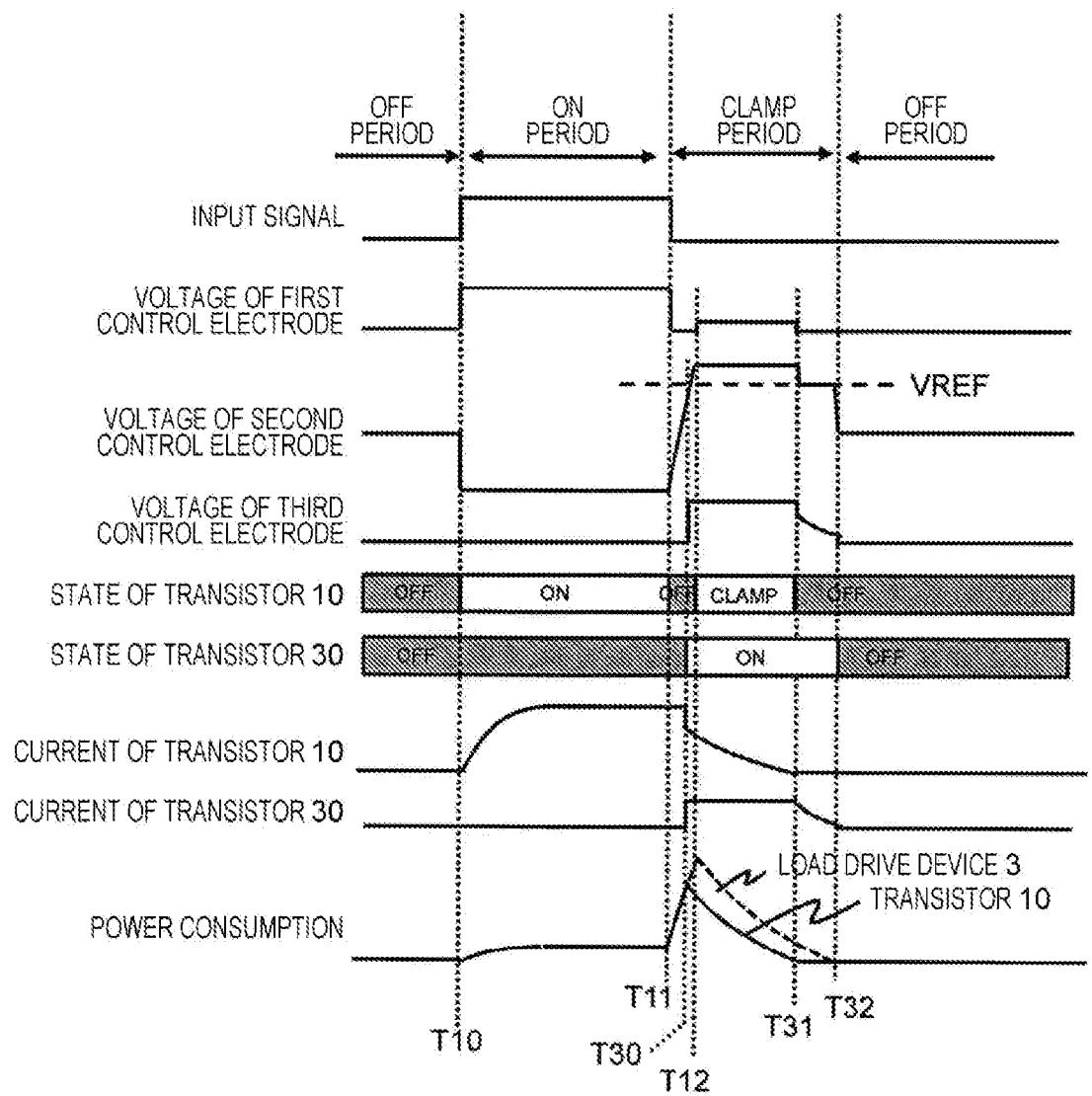
FIG. 6 is a timing chart for describing the operation of the load drive device illustrated in FIG. 5.

FIG. 6 is an example of a timing chart for describing the operation of the load drive device 3 illustrated in FIG. 5.

A difference from the second embodiment is the operation after time T30.

At time T30, when the voltage of the second control electrode 2CE exceeds the voltage VREF of the reference voltage source 310, the voltage of the third control electrode 3CE becomes equal to or higher than the gate Hi-level of the second transistor 30 by the voltage amplifier 300, and the second transistor 30 is turned on.

Next, at time T12, the active clamp circuit 20 becomes conductive, and the voltage of the second control electrode 2CE is clamped to be equal to or lower than a certain value. At this time point, the first transistor 10 consumes the maximum instantaneous power. At the same time, however, the second transistor 30 is turned on, and thus, part of energy released from the induced load 40 is distributed to the second transistor 30 and the resistor 60.

Thereafter, at time T31, the active clamp circuit 20 stops the operation at a time point at which the current flowing through the first transistor 10 decreases to such an extent that it is difficult to maintain a clamp voltage. As a result, the voltage of the second control electrode 2CE decreases to VREF. At this time point, the voltage of the second control electrode 2CE is maintained at the voltage VREF by the voltage amplifier 300.

Finally, the current flowing through the second transistor 30 decreases from time T31 to time T32, and the clamp period ends.

Through the above operation, it is possible to disperse heat generation over the entire period during the active clamp operation in which the power consumption is high, and to achieve the load drive device capable of suppressing local concentration of temperature at the time of absorbing a counter electromotive force of the inductive load while suppressing a size of a power transistor according to the third embodiment, which is similar to the first embodiment.

Fourth Embodiment

Next, a fourth embodiment of the present invention will be described.

Figure 7:
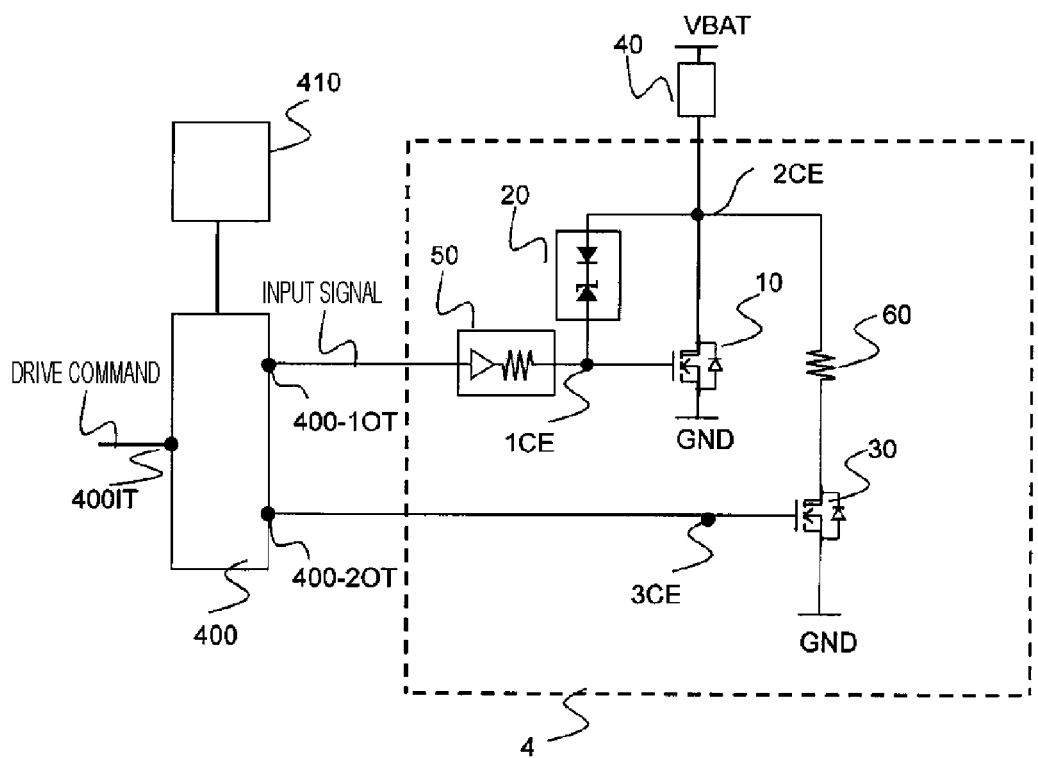
FIG. 7 is a diagram illustrating a load drive device, a control unit (CPU), and a storage unit according to a fourth embodiment.

FIG. 7 is a diagram illustrating a load drive device 4, a control unit (CPU) 400, and a storage unit 410 according to the fourth embodiment.

The fourth embodiment is different from the first embodiment in that the trigger circuit 100 is omitted and the control unit 400 and the storage unit 410 are added. The other configurations have the same functions as the configurations denoted by the same reference signs illustrated in FIG. 1 described above, and thus, the description thereof will be omitted.

In the example illustrated in FIG. 7, the control unit 400 and the storage unit 410 are illustrated as devices separate from the load drive device 4, but the control unit 400 and the storage unit 410 can be provided in the load drive device 4.

In FIG. 7, an input signal to the buffer circuit 50 is output from a first output terminal 400-1OT of the control unit 400, and a second output terminal 400-2OT is connected to the third control electrode 3CE. Then, a drive command for controlling the load drive device 4 is input to an input terminal 400IT of the control unit 400. Further, the control unit 400 is connected to the storage unit 410.

Then, the control unit 400 can control a voltage switching timing of the first output terminal 400-1OT and the second output terminal 400-2OT according to a setting value stored in the storage unit 410. Further, voltages of the first output terminal 400-1OT and the second output terminal 400-2OT of the control unit 400 can be set to the gate Hi-level or the gate Lo-level.

The control unit 400 controls the conduction of the inductive load 40. The control unit 400 outputs a trigger signal corresponding to an inductance value of the inductive load 40, a resistance value, a value of the battery voltage VBAT, and a clamp voltage value from a time point at which the interruption of the inductive load 40 is started. The conduction of the second transistor 30 is controlled by the trigger signal output from the control unit 400.

Here, first, a temporal change of a current flowing through the induced load 40 during the operation of the active clamp circuit 20 will be described with reference to FIG. 8 prior to the description regarding the voltage switching timing of the control unit 400.

Figure 8:
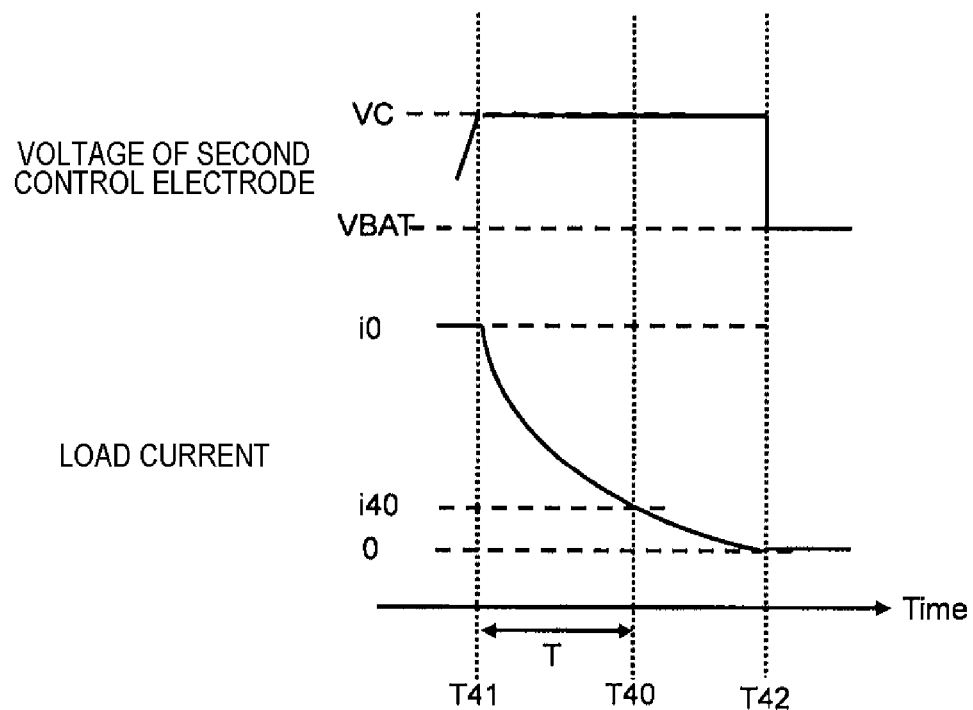
FIG. 8 is a graph illustrating transition between a voltage and a current during the operation of an active clamp circuit in the load drive device illustrated in FIG. 7.

FIG. 8 is a graph illustrating changes of a voltage and a current during the operation of the active clamp circuit 20 when the impedance of the inductive load 40 in the load drive device illustrated in FIG. 7 is regarded as a series model of a component of inductance L and a component of resistance R.

In FIG. 8, T41 is a time when the active clamp circuit 20 starts to conduct, and the load current at this time point is set as i0.

Further, T42 is a time when the active clamp circuit 20 ends the operation, and the load current at this time point is set as 0.

T40 is a time when reaching an arbitrarily specified current value $i_{40}$. Assuming that time taken from time T41 to T40 is T, T is expressed by the following Formula (1).

$$T = (L/R)\log((i_0 + i_e)/(i_{40} + i_e)) \quad (1)$$

The load current $i_0$ in the above Formula (1) is a steady-state current flowing through the inductive load 40 after a lapse of sufficient time in the ON state of the load drive device 4, and can be expressed by the battery voltage VBAT and R as in the following Formula (2).

$$i_0 = \text{VBAT}/R \quad (2)$$

Further, $I_e$ in the above Formula (1) can be expressed by the following Formula (3), and is an absolute value of a convergence value when it is assumed that the voltage of the second control electrode 2CE is set to a clamp voltage VC (voltage clamped by the active clamp circuit 20) for the infinite time, and is one of parameters for calculating T.

$$I_e = (VC - \text{VBAT})/R \quad (3)$$

Assuming that the amount of current flowing through a path (the inductive load 40→the resistor 60→the second transistor 30→GND) of the second transistor 30 during the clamp period is i40, the maximum use is possible until time T40 in FIG. 8. Then, T (between times T41 and T40) can be calculated using the above Formulas (1) to (3). T has L, R, VC, and VBAT as parameters, and it is possible to determine how long the second transistor 30 can be turned on if values of L, R, VC, and VBAT are known in advance.

Hereinafter, the operation of the device illustrated in FIG. 7 will be described with reference to FIG. 9.

Figure 9:
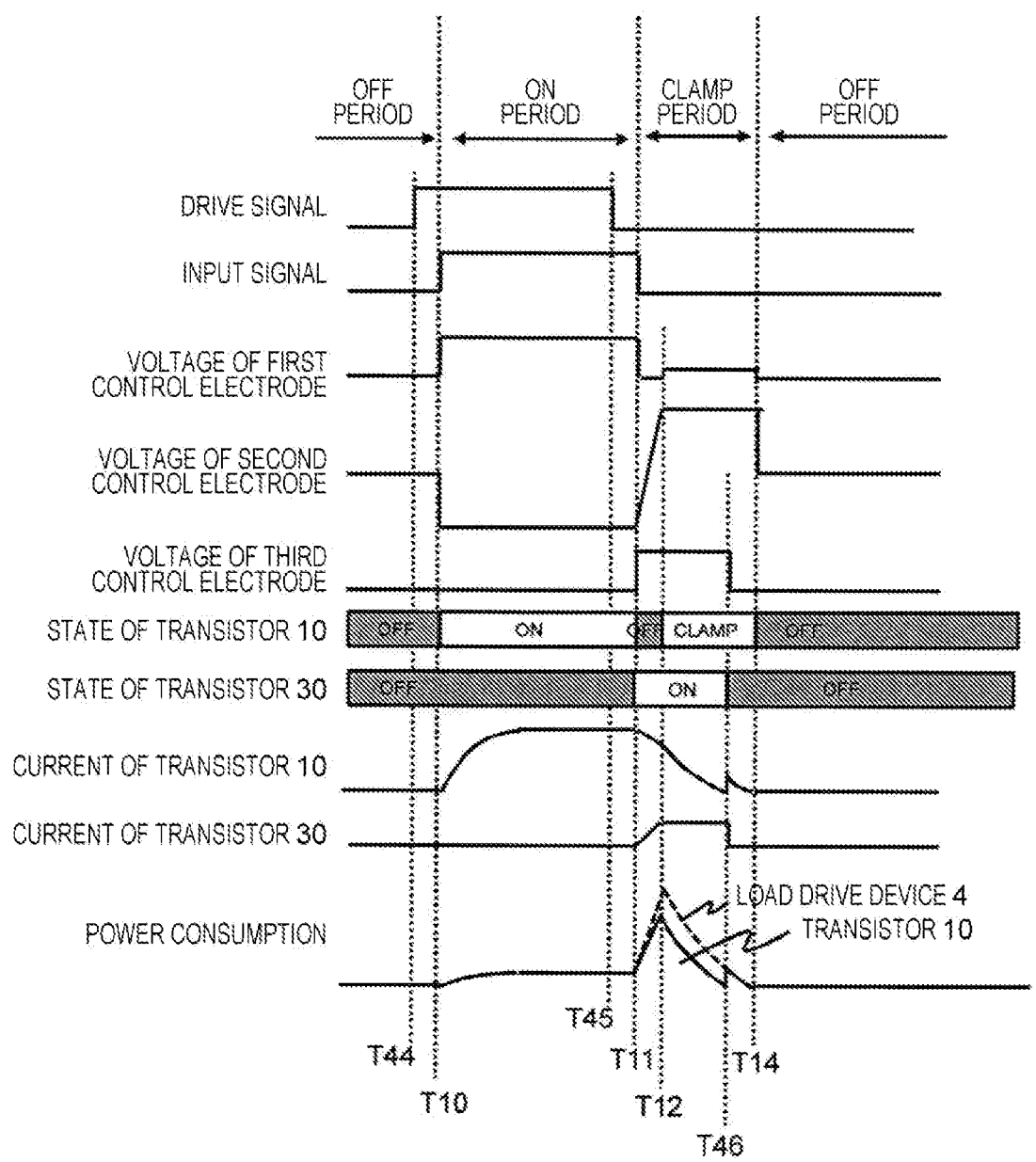
FIG. 9 is a timing chart for describing the operation of the device illustrated in FIG. 7.

FIG. 9 is an example of a timing chart for describing the operation of the device illustrated in FIG. 7.

First, as a precondition, it is assumed that the respective values of L, R, VC, and VBAT are written in the storage unit 410. Further, the control unit 400 reads the respective values in the storage unit 410 to calculate the time T.

First, it is considered that the drive command (a drive signal) input to the control unit 400 is switched from the input Lo-level to the input Hi-level at time T44.

When receiving the drive signal, the control unit 400 switches the input signal with respect to the buffer circuit 50, output from the first output terminal 400-1OT, from the input Lo-level to the output Hi-level at time T10. The voltage of the second output terminal 400-2OT is at the gate Lo-level, and the voltage of the third control electrode 3CE is maintained at the gate Lo-level. The same operation as that in the first embodiment is performed from time T10 to time T45.

Next, when the drive signal is switched to the input Lo-level at time T45, in response to this, the control unit 400 switches the input signal with respect to the buffer circuit 50 to the input Lo-level at time T11. At the same time, the voltage of the second output terminal 400-2OT is set to the gate Hi-level. That is, the voltage of the third control electrode 3CE is switched to the gate Hi-level.

Thereafter, the voltage of the second control electrode 2CE is clamped at T12, and the voltage of the second output terminal 400-2OT is controlled at T46, so that the third control electrode 3CE is switched to the gate Lo-level, and the second transistor 30 is turned off. At this time, a time difference from T11 to T46 is determined by T calculated above.

Finally, the clamp period ends at T14.

Through the above operation, the same effects as those of the first embodiment can be obtained according to the fourth embodiment. In addition, it is possible to set an energy consumption period according to an individual load (the resistance R and the inductance L of inductive load 40) to be connected, and to achieve the load drive device capable of dispersing heat generation using the second transistor 30 to the maximum without affecting the clamp operation.

That is, the energy consumption period is limited to a situation in which destruction is likely to occur by heat according to the fourth embodiment, so that it is possible to achieve the load drive device capable of dispersing the heat generation if necessary while suppressing excessive degradation of components.

Note that a configuration of a low-side driver has been described as all the load drive devices in the above first to fourth embodiments, but a high-side driver may be similarly adopted, and the invention is not limited thereto.

Since the trigger circuits 100 and 200, the voltage amplifier 300, and the control unit 400 in the above first to fourth embodiments control on/off of the second transistor 30, the trigger circuits 100 and 200, the voltage amplifier 300, and the control unit 400 can be collectively referred to as the second transistor control signal output unit that turns on the second transistor 30 at a timing when one transistor 10 is turned off.

Note that the present invention is not limited to the above-described embodiments, but includes various modifications.

For example, the above-described embodiments have been described in detail in order to describe the invention in an easily understandable manner, and are not necessarily limited to those including the entire configuration that has been described above.

That is, a load drive device, provided with the first transistor 10 connected between the first control electrode 10E and the inductive load 40, the active clamp circuit 20 that becomes conductive when a terminal voltage of the second control electrode 2CE between the first transistor 40 and the inductive load 40 exceeds a threshold, and the second transistor 30 connected to the second control electrode 2CE and connected in parallel to the first transistor 10, is also included in the embodiments of the present invention.

As the voltage of the second control electrode 2CE exceeds a certain threshold of the active clamp circuit 20, the active clamp circuit 20 becomes conductive. When the active clamp circuit 20 is conductive, a voltage of the first control electrode 10E rises. Then, the first transistor 10 becomes conductive such that the voltage of the second control electrode 2CE reaches a peak at a constant value. As a result, power is consumed by the first transistor 10. Accordingly, the above example is also included in the present invention.

Further, a load drive device, provided with the first transistor 10 connected between the first control electrode 10E and the inductive load 40, the second transistor 30 connected to the second control electrode 2CE and connected in parallel to the first transistor 10, and the second transistor control signal output unit (the trigger circuit 100 or 200, the voltage amplifier 300, or the control unit 400) that turns on the second transistor 30 at a timing when the first transistor 10 is turned off, is also included in the embodiments of the present invention. The second transistor control signal output unit is a general term for the trigger circuits 100 and 200, the voltage amplifier 300, and the control unit 400. Accordingly, the second transistor control signal output unit may be any of the trigger circuits 100 and 200, the voltage amplifier 300, and the control unit 400.

Even in a case where the active clamp circuit (20 or 21), the buffer circuit 50, and the resistor 60 do not exist, power is consumed by the second transistor 30 by turning on the second transistor 30 at the timing when the first transistor 10 is turned off. Accordingly, the above example is also included in other embodiments of the present invention.

Further, in the other embodiments described above, the following examples are also included in the present invention.

In the other embodiments described above, the buffer circuit 10, which is connected to the first transistor 10 via the first control electrode 10E, receives an input signal for driving the inductive load 40, and drives the first transistor 10, is provided.

Further, in the other embodiments described above, the resistor 60 connected in series to the second transistor 30 is provided.

Further, in the other embodiments described above, the second transistor control signal output unit is a first trigger output circuit (trigger output circuit 100) that outputs a trigger signal from a time point at which the input signal of the buffer circuit is switched from on to off, and conduction of the second transistor 30 is controlled by the trigger signal.

Further, in the other embodiments described above, the active clamp circuit 21, which causes a current to flow from the second control electrode 2CE to the first control electrode 10E when a terminal voltage of the second control electrode 2CE between the first transistor 10 and the inductive load 40 exceeds a threshold, is provided, the second transistor control signal output unit is a second trigger output circuit (trigger output circuit 200) that outputs a trigger signal from a time point at which the active clamp circuit 21 becomes conductive, and the conduction of the second transistor 30 is controlled by the trigger signal.

Further, in the other embodiments described above, the second transistor control signal output unit is the voltage amplifier circuit 300 that compares the voltage of the second control electrode 2CE with a predetermined voltage threshold, the voltage amplifier circuit 300 outputs a voltage level obtained by amplifying a differential voltage between the voltage of the second control electrode 2CE and the voltage threshold, and the conduction of the second transistor 30 is controlled by the amplified voltage level.

Further, in the other embodiments described above, the second transistor control signal output unit is a control unit that controls the conduction of the inductive load 40, the control unit outputs a trigger signal according to an inductance value of the inductive load 40, a resistance value, a battery voltage value, and a clamp voltage value from a time point at which the interruption of the inductive load 40 is started, and the conduction of the second transistor 30 is controlled by the trigger signal.

Further, in the other embodiments described above, the active clamp circuit 20, which causes a current to flow from the second control electrode 2CE to the first control electrode 10E when a terminal voltage of the second control electrode 2CE between the first transistor 10 and the inductive load 40 exceeds a threshold, is provided. The embodiments of the present invention also includes the example in which the active clamp circuit 20 that performs the operation of the first embodiment is provided in the other embodiments described above.

Further, some configurations of a certain embodiment can be substituted by configurations of another embodiment, and further, a configuration of another embodiment can be also added to a configuration of a certain embodiment.

Further, addition, deletion or substitution of other configurations can be made with respect to some configurations of each embodiment.

Further, the signal polarity described in the timing chart is an example, and the invention is not limited thereto.

Further, a part or all of each of the above-described configurations, functions, processing units, processing means, and the like may be implemented by, for example, hardware designed with one integrated circuit and the like or by a plurality of integrated circuits.

REFERENCE SIGNS LIST 1, 2, 3, 4 load drive device
1CE first control electrode
1T first terminal
2CE second control electrode
2T second terminal
3CE third control electrode
3T third terminal
10 first transistor
20, 21 active clamp circuit
30 second transistor
40 inductive load
50 buffer circuit
60 resistor
100, 200 trigger circuit
300 voltage amplifier
310 reference voltage source
400 control unit
400IT input terminal
400-1OT first output terminal
400-2OT second output terminal

The invention claimed is:

1. A load drive device comprising:
a first transistor connected between a first control electrode and an inductive load;
an active clamp circuit that becomes conductive when a terminal voltage of a second control electrode between the first transistor and the inductive load exceeds a threshold;
a second transistor connected to the second control electrode and connected in parallel to the first transistor;
a buffer circuit that is connected to the first transistor via the first control electrode, receives an input of an input signal for driving the inductive load, and drives the first transistor;
a resistor connected in series to the second transistor, and
a voltage amplifier circuit that compares a voltage of the second control electrode with a predetermined voltage threshold,
wherein the voltage amplifier circuit outputs a voltage level obtained by amplifying a differential voltage between the voltage of the second control electrode and the voltage threshold, and
conduction of the second transistor is controlled by the amplified voltage level.

2. The load drive device according to claim 1, further comprising
a first trigger output circuit that outputs a trigger signal from a time point at which the input signal of the buffer circuit is switched from on to off,
wherein conduction of the second transistor is controlled by the trigger signal.

3. The load drive device according to claim 1, further comprising
a second trigger output circuit that outputs a trigger signal from a time point at which the active clamp circuit becomes conductive,
wherein conduction of the second transistor is controlled by the trigger signal.

4. The load drive device according to claim 1, further comprising
a control unit that controls conduction of the inductive load,
wherein the control unit outputs a trigger signal according to an inductance value of the inductive load, a resistance value, a battery voltage value, and a clamp voltage value from a time point at which interruption of the inductive load is started, and
conduction of the second transistor is controlled by the trigger signal.

5. A load drive device comprising:
a first transistor connected between a first control electrode and an inductive load;
a second transistor connected to the second control electrode and connected in parallel to the first transistor;
a second transistor control signal output unit that turns on the second transistor at a timing when the first transistor is turned off;
a buffer circuit that is connected to the first transistor via the first control electrode, receives an input of an input signal for driving the inductive load, and drives the first transistor;
a resistor connected in series to the second transistor, and
the second transistor control signal output unit is a voltage amplifier circuit that compares a voltage of the second control electrode with a predetermined voltage threshold,
the voltage amplifier circuit outputs a voltage level obtained by amplifying a differential voltage between the voltage of the second control electrode and the voltage threshold, and
conduction of the second transistor is controlled by the amplified voltage level.

6. The load drive device according to claim 5, wherein the second transistor control signal output unit is a first trigger output circuit that outputs a trigger signal from a time point at which the input signal of the buffer circuit is switched from on to off, and conduction of the second transistor is controlled by the trigger signal.

7. The load drive device according to claim 5, further comprising
an active clamp circuit that causes a current to flow from the second control electrode to the first control electrode when a terminal voltage of the second control electrode between the first transistor and the inductive load exceeds a threshold,
wherein the second transistor control signal output unit is a second trigger output circuit that outputs a trigger signal from a time point at which the active clamp circuit becomes conductive, and
conduction of the second transistor is controlled by the trigger signal.

8. The load drive device according to claim 5, wherein the second transistor control signal output unit is a control unit that controls conduction of the inductive load,
the control unit outputs a trigger signal according to an inductance value of the inductive load, a resistance value, a battery voltage value, and a clamp voltage value from a time point at which interruption of the inductive load is started, and conduction of the second transistor is controlled by the trigger signal.

9. The load drive device according to claim 5, further comprising an active clamp circuit that causes a current to flow from the second control electrode to the first control electrode when a terminal voltage of the second control electrode between the first transistor and the inductive load exceeds a threshold.

\* \* \* \* \*